(12) United States Patent
Aoki et al.

(10) Patent No.: US 11,178,790 B2
(45) Date of Patent: Nov. 16, 2021

(54) IMMERSION TANK AND ELECTRONIC APPARATUS

(71) Applicant: FUJITSU LIMITED, Kawasaki (JP)

(72) Inventors: Michimasa Aoki, Kawasaki (JP); Masumi Suzuki, Kawasaki (JP); Mitsutaka Yamada, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 81 days.

(21) Appl. No.: 16/845,127

(22) Filed: Apr. 10, 2020

(65) Prior Publication Data

US 2020/0337176 A1  Oct. 22, 2020

(30) Foreign Application Priority Data

Apr. 22, 2019  (JP) .............................. JP2019-081183

(51) Int. Cl.
*H05K 7/20* (2006.01)
*F28D 20/02* (2006.01)

(52) U.S. Cl.
CPC ........... *H05K 7/203* (2013.01); *F28D 20/028* (2013.01); *H05K 7/20327* (2013.01)

(58) Field of Classification Search
CPC .............. H05K 7/203; H05K 7/20327; H05K 7/20236; H05K 7/2079; H05K 7/20809; H05K 7/20272; H05K 7/20781; H05K 7/20818; H05K 7/20281; H05K 7/20772; H05K 7/20836; H05K 7/20763; H05K 7/20263; H05K 7/20927; H05K 5/06; H05K 7/20872; F28D 20/028; F28D 15/0266; F28D 15/06; G06F 1/20; G06F 2200/201; G06F 1/206; H01L 23/473; H01L 23/44; H01L 21/67109; F24H 4/04; F28F 2280/10; F28F 13/125
USPC ......................................................... 361/700
See application file for complete search history.

(56) References Cited

U.S. PATENT DOCUMENTS

2015/0062806 A1* 3/2015 Shelnutt ............. H05K 7/20309
                                                        361/679.53
2018/0070477 A1   3/2018 Saito

FOREIGN PATENT DOCUMENTS

JP    H09-283677 A    10/1997
WO    2016/157397 A1  10/2016

* cited by examiner

*Primary Examiner* — Mandeep S Buttar
(74) *Attorney, Agent, or Firm* — Fujitsu Patent Center

(57) ABSTRACT

An immersion tank includes a tank main body that includes a storage unit that stores a cooling liquid in which an electronic device is immersed, an upper part of the storage unit having an opening, a lid body that includes a top wall portion and a side wall portion, and is paired with the tank main body, and a gas-phase heat exchanger that cools a space between the storage unit and the top wall portion.

18 Claims, 5 Drawing Sheets

IMMERSION TANK AND ELECTRONIC APPARATUS

CROSS-REFERENCE TO RELATED APPLICATION

This application is based upon and claims the benefit of priority of the prior Japanese Patent Application No. 2019-81183, filed on Apr. 22, 2019, the entire contents of which are incorporated herein by reference.

FIELD

The embodiments discussed herein are related to an immersion tank and electronic apparatus.

BACKGROUND

There is an electronic apparatus including an immersion tank that stores a cooling liquid, and a heat exchanger that is provided in the immersion tank and cools the cooling liquid, the electronic apparatus cooling an electronic device immersed in the cooling liquid.

For example, Japanese Laid-open Patent Publication No. 9-283677, International Publication Pamphlet No. WO 2016/157397, and the like are disclosed as related art.

SUMMARY

According to an aspect of the embodiments, An immersion tank includes a tank main body that includes a storage unit that stores a cooling liquid in which an electronic device is immersed, an upper part of the storage unit having an opening, a lid body that includes a top wall portion and a side wall portion, and is paired with the tank main body, and a gas-phase heat exchanger that cools a space between the storage unit and the top wall portion.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Some immersion tanks include, for example, a tank main body that stores a cooling liquid, and a lid body that opens and closes an opening portion on an upper end side of the tank main body. In these immersion tanks, the release of the cooling liquid vaporized due to heat exchange with an electronic apparatus to the outside of the immersion tank is suppressed by closing the opening portion of the immersion tank with the lid body.

However, when the vaporization amount of the cooling liquid increases, the internal pressure of an upper space in the immersion tank rises. Then, when the internal pressure of the upper space in the immersion tank rises, a gap is produced between the tank main body and the lid body, and there is a possibility that the vaporized cooling liquid is released to the outside of the immersion tank, and the cooling liquid in the immersion tank decreases in amount.

The technology disclosed in the present application has, as one aspect, an object of suppressing the release of a vaporized cooling liquid to the outside of an immersion tank through a gap between a tank main body and a lid body.

According to the technology disclosed in the present application, as one aspect, the release of a vaporized cooling liquid to the outside of an immersion tank through a gap between a tank main body and a lid body may be suppressed.

First Embodiment

Figure 1:
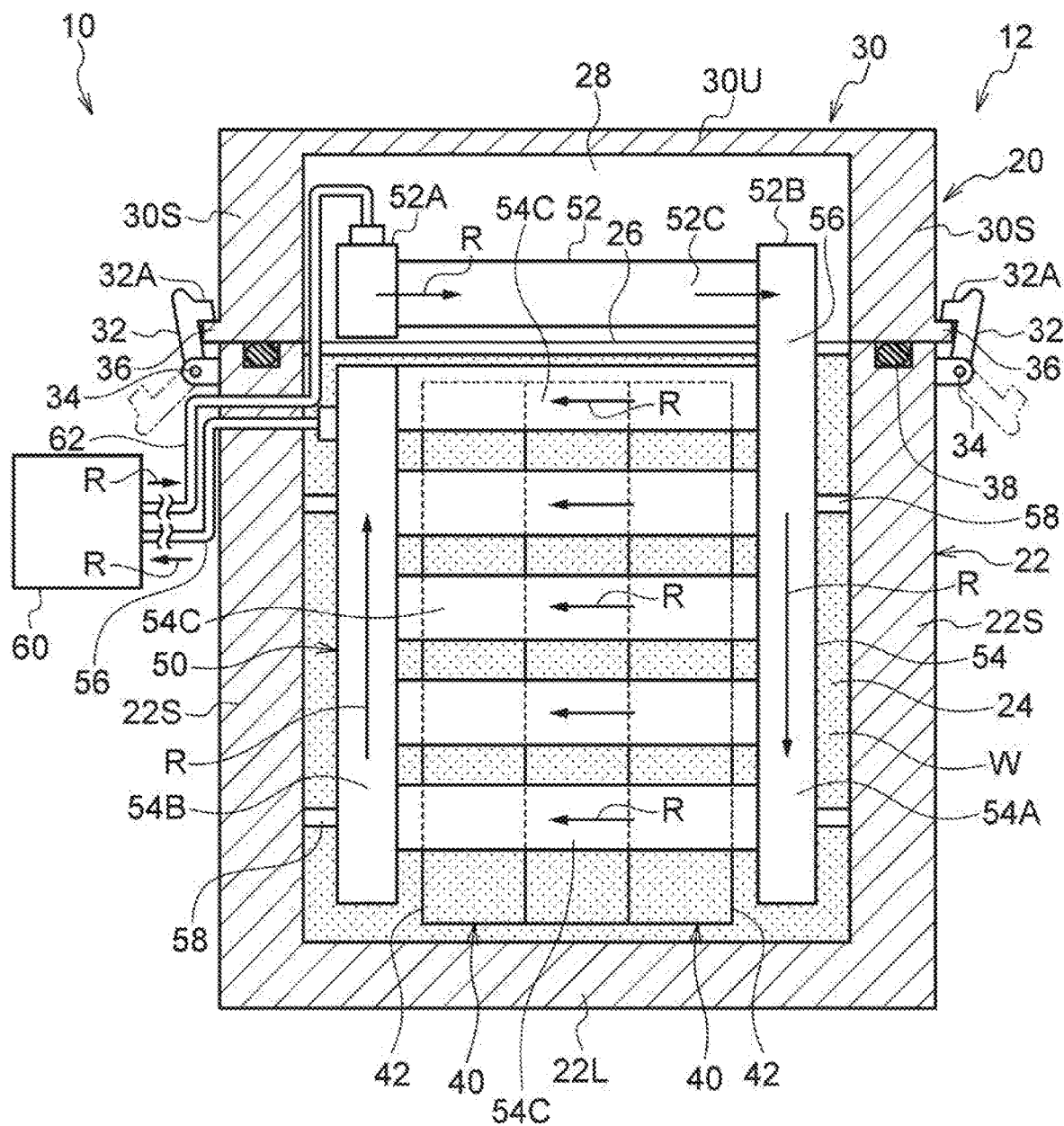
FIG. 1 is a longitudinal sectional view illustrating an immersion tank according to a first embodiment.

First, a first embodiment will be described.
(Immersion Cooling System, Electronic Apparatus)
FIG. 1 illustrates an immersion cooling system 10 according to the first embodiment. The immersion cooling system 10 includes an electronic apparatus 12 and an external cooling device 60. The electronic apparatus 12 includes an immersion tank 20 and a plurality of electronic units 40.
(Immersion Tank)
The immersion tank 20 includes a tank main body 22 and a lid body 30. The tank main body 22 is configured as a box-shaped container whose upper part has an opening. This tank main body 22 includes a bottom wall portion 22L and a plurality (four in the present embodiment) of side wall portions 22S. The plurality of side wall portions 22S extends upward from an outer periphery portion of the bottom wall portion 22L.

The tank main body 22 includes a storage unit 24 and an opening portion 26. The storage unit 24 is an area of an internal space of the tank main body 22 where a cooing liquid W is stored. The cooling liquid W is, for example, a liquid refrigerant having insulation property, heat conductivity, and inertness. As this cooling liquid W, for example, a fluorine-based inert liquid or oil is used.

The opening portion 26 is formed at an upper end portion of the tank main body 22 and opens an upper part of the storage unit 24. The plurality of electronic units 40 described later is accommodated in the storage unit 24 through this opening portion 26. Furthermore, the opening portion 26 can be opened and closed by the lid body 30.

The lid body 30 is formed in a box shape with its lower part opened in a state in which the opening portion 26 of the tank main body 22 is closed. Note that, hereinafter, unless otherwise specified, the configuration of the lid body 30 will be described based on a state in which the opening portion 26 of the tank main body 22 is closed.

The lid body 30 includes a top wall portion 30U and a plurality (four in the present embodiment) of side wall portions 30S. The top wall portion 30O covers the opening portion 26 of the tank main body 22 from above. The plurality of side wall portions 30S is provided on an outer periphery portion of this top wall portion 30U.

The plurality of side wall portions 30S extends downward from the outer periphery portion of the top wall portion 30U. Furthermore, the lid body 30 is attached to, for example, upper end portions of the side wall portions 22S of the tank main body 22 via a hinge portion (not illustrated). Then, the opening portion 26 of the tank main body 22 is opened and closed by rotating the lid body 30 about the hinge portion.

The lid body 30 is fixed to the tank main body 22 by a pair of fixing hooks 32. The pair of fixing hooks 32 are attached to upper portions of the side wall portions 22S on two sides of the tank main body 22 via hinge portions 34. A claw portion 32A is provided at a tip portion of each fixing hook 32.

A pair of locking portions 36 protruding outward are provided at lower portions of the side wall portions 30S of the lid body 30 on two sides. The claw portions 32A of the pair of fixing hooks 32 are locked to this pair of locking portions 36, whereby the lid body 30 is fixed to the tank main body 22.

Note that the lid body 30 is not limited to being fixed to the tank main body 22 by the pair of fixing hooks 32, and may be fixed to the tank main body 22 by another fixing tool or fixing structure.

Figure 2:
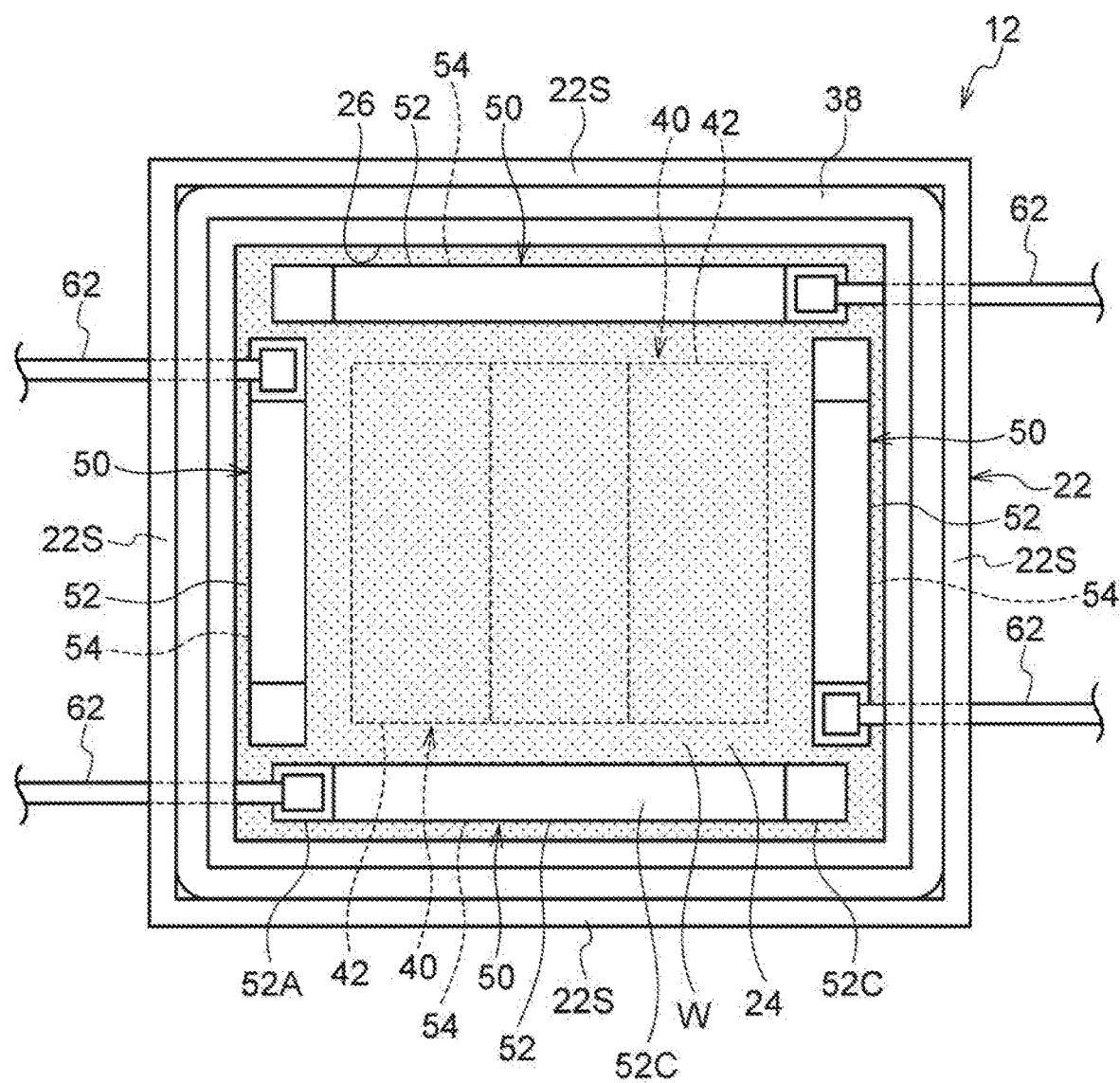
FIG. 2 is a plan view illustrating a tank main body illustrated in FIG. 1.

As illustrated in FIG. 2, a sealing material 38 is provided on a peripheral edge portion of the opening portion 26 of the tank main body 22. The sealing material 38 is formed in an annular shape and surrounds the opening portion 26. A gap between the tank main body 22 and the lid body 30 is sealed by this sealing material 38.

(Electronic Unit)

As illustrated in FIG. 1, the storage unit 24 of the immersion tank 20 accommodates, for example, the plurality of electronic units 40 such as servers. Each electronic unit 40 includes a housing 42 and a printed circuit board (not illustrated) accommodated in the housing 42. A plurality of electronic components that generate heat is mounted on the printed circuit board. Note that the electronic unit 40 is an example of an electronic device.

The plurality of electronic units 40 is accommodated in the storage unit 24 through the opening portion 26. Furthermore, the plurality of electronic units 40 is accommodated in the tank main body 22 while being immersed in the cooling liquid W in the storage unit 24.

Note that a cable (not illustrated) is connected to each electronic unit 40, and electric power is supplied from the outside of the immersion tank 20 via this cable.

Here, wen the lid body 30 is closed while the plurality of electronic units 40 is immersed in the cooling liquid W stored in the storage unit 24 of the tank main body 22, a space where the cooling liquid W does not exist is formed at an upper portion of the immersion tank 20 (hereinafter, referred to as "upper space 28"). The upper space 28 is formed across the upper portion of the tank main body 22 and the lid body 30.

For example, the upper space 28 is formed between the top wall portion 30U of the lid body 30 and the storage unit 24. This means, for example, that the upper space 28 is formed between the top wall portion 30U of the lid body 30 and the liquid surface of the cooling liquid W. The vaporized cooling liquid W is accumulated in this upper space 28.

(Heat Exchanger)

As illustrated in FIG. 2, a plurality of (four in the present embodiment) heat exchangers 50 is provided inside the tank main body 22. The plurality of heat exchangers 50 is formed in a wall shape, and is arranged on an outer periphery portion of the storage unit 24. Furthermore, each heat exchanger 50 is arranged along an inner side surface of the storage unit 24, for example, an inner surface of the side wall portion 22S of the tank main body 22. A space for accommodating the plurality of electronic units 40 is formed in a center portion of the tank main body 22 enclosed by these heat exchangers 50.

Note that the number and arrangement of the heat exchangers 50 can be changed as appropriate.

As illustrated in FIG. 1, the heat exchanger 50 is arranged to span the storage unit 24 of the immersion tank 20 and the upper space 28. Furthermore, the heat exchanger 50 is fixed to the side wall portion 22S of the tank main body 22 via a plurality of stays 58. This heat exchanger 50 includes a gas-phase heat exchange unit 52 and a liquid-phase heat exchange unit 54. Note that the gas-phase heat exchange unit 52 is an example of a gas-phase heat exchanger. Furthermore, the liquid-phase heat exchange unit 54 is an example of a liquid-phase heat exchanger.

The gas-phase heat exchange unit 52 is configured as a heat exchange unit that cools the upper space 28, and is arranged (accommodated) in the upper space 28 on the side of the lid body 30. This gas-phase heat exchange unit 52 includes a pair of header units 52A and 52B and a flow path unit 52C. The pair of header units 52A and 52B are arranged with an interval in a lateral width direction of the heat exchanger 50.

A supply pipe (refrigerant supply pipe) 62 is connected to the header unit 52A, which is one header unit out of the pair of header units 52A and 52B. The supply pipe 62 passes through an upper portion of the side wall portion 22S of the tank main body 22, and extends outside the tank main body 22. The external cooling device 60 described later is connected to this supply pipe 62. Therefore, a refrigerant R is supplied from the external cooling device 60 to the one header unit 52A of the gas-phase heat exchange unit 52 via the supply pipe 62.

The other header unit 52B is connected to the one header unit 52A via the flow path unit 52C. The flow path unit 52C stretches in the lateral width direction of the heat exchanger 50. The refrigerant R is supplied from the one header unit 52A to the other header unit 52B via this flow path unit 52C. At this time, the refrigerant R flowing through the flow path unit 52C exchanges heat with the air in the upper space 28, thereby cooling the upper space 28. Note that a liquid or a gas is used as the refrigerant R.

The liquid-phase heat exchange unit 54 is configured as a heat exchange unit that cools the cooling liquid W stored in the storage unit 24, and is arranged in the storage unit 24. Furthermore, the liquid-phase heat exchange unit 54 is arranged to span the storage unit 24 from a lower end side (bottom side) to an upper end side. This liquid-phase heat exchange unit 54 includes a pair of header units 54A and 54B and a plurality of flow path units 54C.

The pair of header units 54A and 54B stretch in a height direction of the heat exchanger 50, and are arranged with an interval in the lateral width direction of the heat exchanger 50. The header unit 54A, which is one header unit out of the pair of header units 54A and 54B, is connected to the other header unit 52B of the gas-phase heat exchange unit 52 via a connection duct 56. Therefore, the refrigerant R is supplied from the other header unit 52B of the gas-phase heat exchange unit 52 to the one header unit 54A of the liquid-phase heat exchange unit 54. For example, the refrigerant R is sent from the gas-phase heat exchange unit 52 to the storage unit 24.

The other header unit 54B of the liquid-phase heat exchange unit 54 is connected to the one header unit 54A via the plurality of flow path units 54C. The plurality of flow path units 54C stretches in the lateral width direction of the heat exchanger 50, and is arranged at intervals in the height direction of the heat exchanger 50. The refrigerant R is supplied from the one header unit 54A to the other header unit 54B via these flow path units 54C. At this time, the refrigerant R flowing through the plurality of flow path units 54C exchanges heat with the cooling liquid W in the storage unit 24, thereby cooling the cooling liquid W.

A discharge pipe (refrigerant discharge pipe) 64 is connected to an upper portion of the other header unit 54B. The discharge pipe 64 passes through an upper portion of the side wall portion 22S of the tank main body 22, and extends outside the tank main body 22. Furthermore, the external cooling device 60 is connected to the discharge pipe 64. Therefore, the refrigerant R is discharged from the other header unit 54B to the external cooling device 60 via the discharge pipe 64.

(External Cooling Device)

The external cooling device 60 is configured as, for example, a refrigerator or a cooling tower (chiller) that cools the refrigerant R. This external cooling device 60 cools the refrigerant R discharged from the liquid-phase heat exchange unit 54 of the heat exchanger 50 via the discharge pipe 64, and supplies the cooled refrigerant R to the gas-phase heat exchange unit 52 of the heat exchanger 50 via the supply pipe 62.

At least one of the supply pipe 62 and the discharge pipe 64 is provided with a pump (not illustrated). When this pump is operated, the refrigerant R is supplied from the external cooling device 60 to the gas-phase heat exchange unit 52 of the heat exchanger 50 via the supply pipe 62. Furthermore, the refrigerant R discharged from the liquid-phase heat exchange unit 54 of the heat exchanger 50 is supplied to the external cooling device 60 via the discharge pipe 64. For example, when the pump is operated, the refrigerant R is circulated between the external cooling device 60 and the heat exchanger 50.

Note that the discharge pipe 64 and the supply pipe 62 form a circulation path for circulating the refrigerant R between the heat exchanger 50 and the external cooling device 60. In addition, arrows illustrated in FIG. 1 indicate directions in which the refrigerant R circulates.

(Actions)

Next, the actions of the first embodiment will be described.

FIG. 1 illustrates a state in which the plurality of electronic units 40 is immersed in the cooling liquid W stored in the storage unit 24 of the tank main body 22, with the lid body 30 of the immersion tank 20 closed. In this state, when a pump (not illustrated) provided on at least one of the supply pipe 62 and the discharge pipe 64 is operated, the refrigerant R circulates between the external cooling device 60 and the heat exchanger 50.

Therefore, the refrigerant R cooled by the external cooling device 60 is continuously supplied to the heat exchanger 50, and the cooling liquid W in the storage unit 24 is cooled by the liquid-phase heat exchange unit 54 of the heat exchanger 50. For example, the refrigerant R flowing through the liquid-phase heat exchange unit 54 exchanges heat with the cooling liquid W, thereby cooling the cooling liquid W. As a result, the plurality of electronic units 40 immersed in the cooling liquid W is cooled.

Here, when the cooling liquid W in the storage unit 24 is heated by the plurality of electronic units 40, the cooling liquid W evaporates and accumulates in the upper space 28 at an upper part of the storage unit 24. Therefore, when the internal pressure of the upper space 28 rises, a gap is produced between the tank main body 22 and the lid body 30, and there is a possibility that the vaporized cooling liquid W is released to the outside of the immersion tank 20.

As a countermeasure to this phenomenon, in the present embodiment, the gas-phase heat exchange unit 52 of the heat exchanger 50 is arranged in the upper space 28. The refrigerant R cooled by the external cooling device 60 is continuously supplied to this gas-phase heat exchange unit 52 via the supply pipe 62. Therefore, the upper space 28 is cooled by the gas-phase heat exchange unit 52. For example, the refrigerant R flowing through the gas-phase heat exchange unit 52 exchanges heat with the air in the upper space 28, thereby cooling the upper space 28.

Then, when the upper space 28 is cooled, the vaporized cooling liquid W is condensed, and the internal pressure of the upper space 28 lowers. Therefore, producing a gap between the tank main body 22 and the lid body 30 is suppressed. As a result, the release of the vaporized cooling liquid W to the outside of the immersion tank 20 through a gap between the tank main body 22 and the lid body 30 is suppressed. Accordingly, a decrease in amount of the cooling liquid W in the storage unit 24 is suppressed.

Furthermore, the upper space 28 is cooled by the gas-phase heat exchange unit 52, and the upper space 28 is negatively pressurized, whereby the lid body 30 is brought into close contact with the tank main body 22 and the immersion tank 20 is sealed. Accordingly, the release of the vaporized cooling liquid W to the outside of the immersion tank 20 through a gap between the tank main body 22 and the lid body 30 is further suppressed.

Note that the refrigerant R cooled by the external cooling device 60 is supplied to the gas-phase heat exchange unit 52 before the liquid-phase heat exchange unit 54. This is because, if the refrigerant R cooled by the external cooling device 60 is supplied to the gas-phase heat exchange unit 52 after the liquid-phase heat exchange unit 54, the refrigerant R that has absorbed heat in the liquid-phase heat exchange unit 54 flows into the gas-phase heat exchange unit 52 and the upper space 28 becomes difficult to cool sufficiently.

In addition, the gas-phase heat exchange unit 52 is attached to the tank main body 22. Therefore, in the present embodiment, the lid body 30 may be easily opened and closed as compared with a case where the gas-phase heat exchange unit 52 is attached to the lid body 30.

Moreover, as illustrated in FIG. 2, the respective liquid-phase heat exchange units 54 of the heat exchangers 50 are provided along inner side surfaces of the storage unit 24, and enclose the plurality of electronic units 40 accommodated in a center portion of the storage unit 24. Therefore, the plurality of electronic units 40 may be efficiently cooled by the liquid-phase heat exchange units 54, while a space for accommodating the plurality of electronic units 40 is secured in the storage unit 24.

The gas-phase heat exchange unit 52 is arranged (accommodated) in the upper space 26 on the side of the lid body 30. Therefore, in the present embodiment, compared with a case where the gas-phase heat exchange unit 52 is not arranged in the upper space 28 on the side of the lid body 30, but is arranged only in the upper space 28 on the side of the tank main body 22, a space for accommodating the electronic units 40 in the tank main body 22 may be expanded.

Second Embodiment

Next, a second embodiment will be described. Note that, in the second embodiment, members and the like having the same configurations as those in the first embodiment are denoted by the same reference numerals, and description thereof will be omitted.

Figure 3:
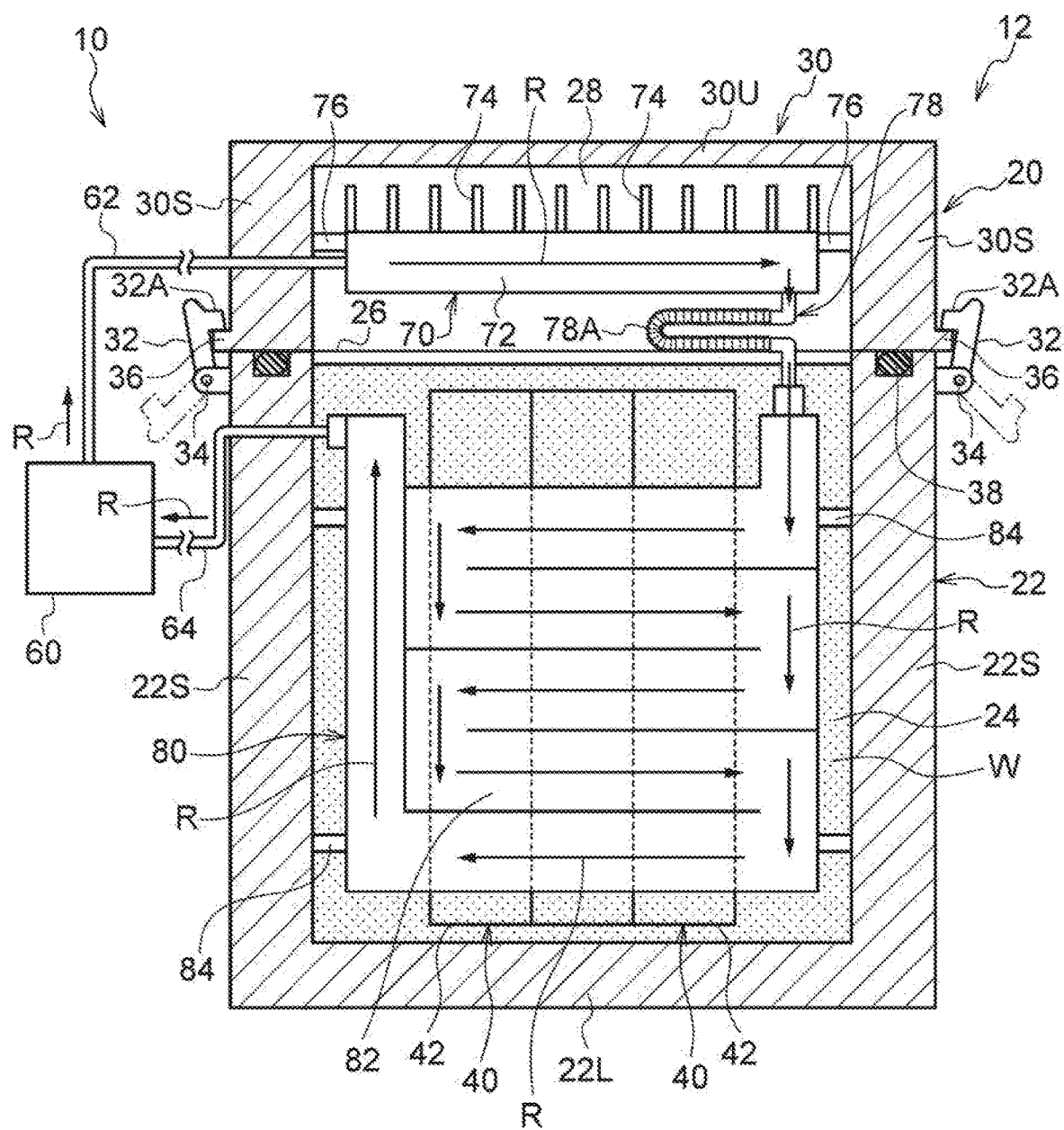
FIG. 3 is a longitudinal sectional view illustrating an immersion tank according to a second embodiment.
Figure 4:
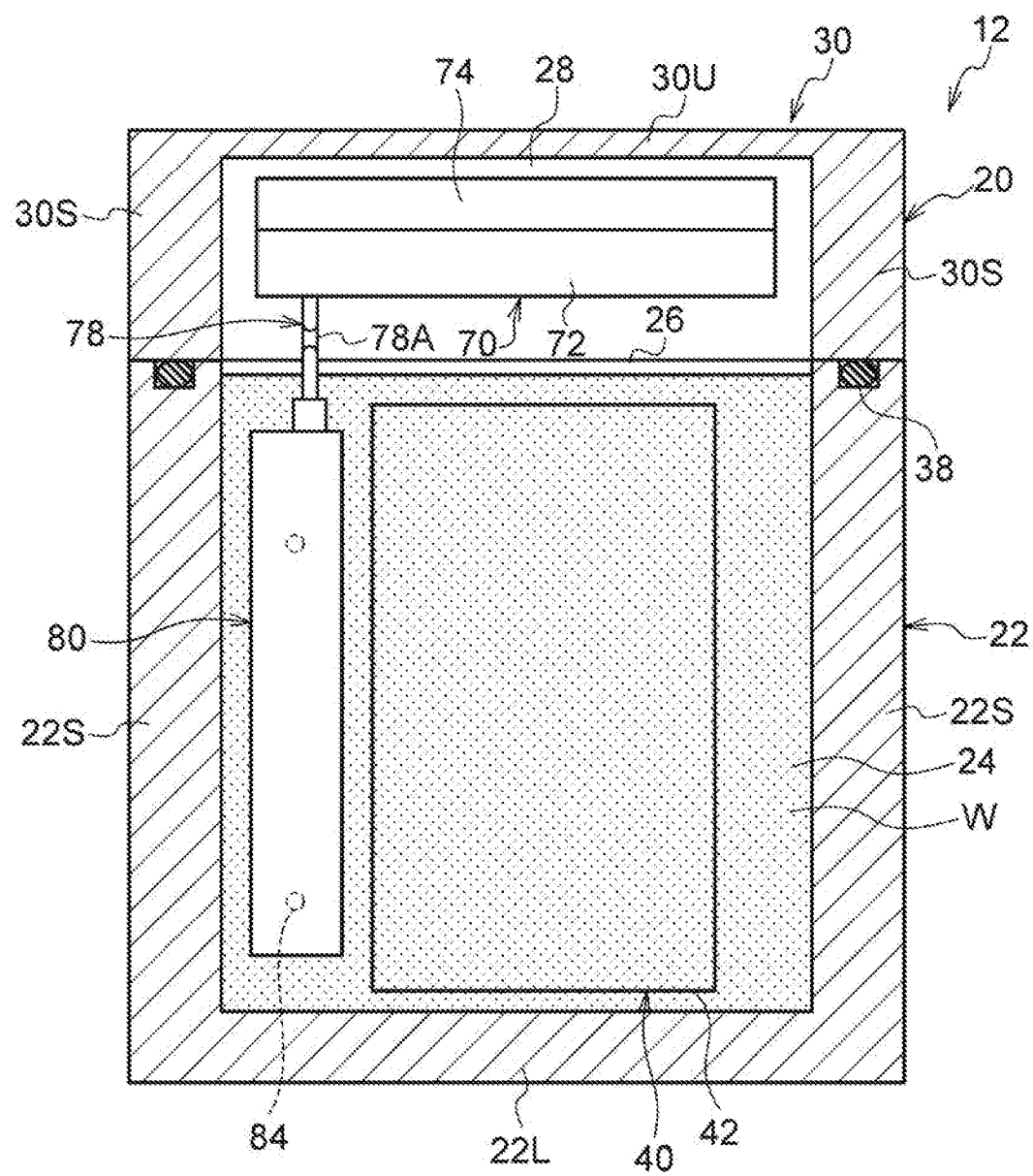
FIG. 4 is a longitudinal sectional view of the immersion tank illustrated in FIG. 3 as viewed from the right side.

FIGS. 3 and 4 illustrate an immersion tank 20 according to the second embodiment. A gas-phase heat exchanger 70 and a liquid-phase heat exchanger 80 are provided inside this immersion tank 20.

The gas-phase heat exchanger 70 is configured as a heat exchanger that cools an upper space 28, and is arranged (accommodated) in the upper space 28 on the side of a lid body 30. This gas-phase heat exchanger 70 includes a heat exchanger main body 72 and a plurality of fins 74.

The heat exchanger main body 72 is formed in a flat box shape, and is accommodated inside the lid body 30 (upper space 28) in a laterally situated state. The heat exchanger main body 72 covers a plurality of electronic units 40 immersed in a cooling liquid W in a storage unit 24 from above. This heat exchanger main body 72 is fixed to the lid body 30 via a plurality of stays 76.

A supply pipe (refrigerant supply pipe) 62 is connected to one end portion of the heat exchanger main body 72. The supply pipe 62 passes through a side wall portion 30S of the lid body 30, and is connected to an external cooling device 60. Therefore, a refrigerant R is supplied from the external cooling device 60 to the heat exchanger main body 72 via the supply pipe 62. Furthermore, a flow path (not illustrated) through which the refrigerant R supplied from the supply pipe 62 flows is formed inside the heat exchanger main body 72. This flow path is configured as, for example, a meandering flow path that meanders as viewed in plan.

The plurality of fins 74 is provided on an upper surface of the heat exchanger main body 72. The plurality of fins 74 is arranged at intervals. The cooling efficiency for the upper space 28 by the gas-phase heat exchanger 70 is enhanced by these fins 74.

The liquid-phase heat exchanger 80 is connected to another end portion of the heat exchanger main body 72 via a flexible pipe 78. Therefore, the refrigerant R is supplied from the heat exchanger main body 72 to the liquid-phase heat exchanger 80 via the flexible pipe 78. For example, the refrigerant R is sent from the gas-phase heat exchanger 70 to the storage unit 24.

For example, the flexible pipe 78 is formed of a rubber tube or the like. This flexible pipe 78 includes an extra length portion 78A. The extra length portion 78A has a predetermined length that allows the Rd body 30 to be opened and closed. This extra length portion 78A is formed, for example, to be extendable and contractible.

Note that the heat exchanger main body 72 and the liquid-phase heat exchanger 80 may be detachably connected to each other not via the flexible pipe 78.

The liquid-phase heat exchanger 80 is configured as a heat exchanger that cools the cooling liquid W stored in the storage unit 24, and is arranged in the storage unit 24. Furthermore, the liquid-phase heat exchanger 80 is formed in a wall shape, and is arranged along one inner side surface of the storage unit 24.

The liquid-phase heat exchanger 80 is arranged to span the storage unit 24 of a tank main body 22 from a lower end side (bottom side) to an upper end side. Furthermore, the liquid-phase heat exchanger 80 is fixed to the side wall portion 22S of the tank main body 22 via a plurality of stays 84. A flow path 82 through which the refrigerant R supplied from gas-phase heat exchanger 70 flows is formed inside this liquid-phase heat exchanger 80. The flow path 82 is configured as, for example, a meandering flow path that meanders in an elevation view.

A discharge pipe (refrigerant discharge pipe) 64 is connected to an upper portion of the liquid-phase heat exchanger 80. Therefore, the refrigerant R is circulated between the external cooling device 60, the gas-phase heat exchanger 70, and the liquid-phase heat exchanger 80.

(Actions)

Next, the actions of the second embodiment will be described.

According to the present embodiment, the gas-phase heat exchanger 70 and the liquid-phase heat exchanger 80 are provided inside the immersion tank 20. The gas-phase heat exchanger 70 is arranged in the upper space 28, and covers the plurality of electronic units 40 immersed in the cooling liquid W in the storage unit 24 from above.

Therefore, the cooling liquid W vaporized due to heat exchange with the electronic units 40 easily comes into contact with the gas-phase heat exchanger 70. For this reason, in the present embodiment, the cooling efficiency for the vaporized cooing liquid W is enhanced as compared with a case where the plurality of electronic units 40 is not covered from above by the gas-phase heat exchanger 70. As a result, in the present embodiment, the upper space 28 may be negatively pressurized earlier and the immersion tank 20 may be sealed. Accordingly, the release of the vaporized cooling liquid W to the outside of the immersion tank 20 through a gap between the tank main body 22 and the lid body 30 is suppressed.

Furthermore, the gas-phase heat exchanger 70 is fixed to the lid body 30. Therefore, when the lid body 30 is opened, the gas-phase heat exchanger 70 moves from above the plurality of electronic units 40 together with the lid body 30. Accordingly, the exchangeability and the maintainability of the plurality of electronic units 40 may be enhanced, while the upper space 28 is cooled by the gas-phase heat exchanger 70.

Moreover, the gas-phase heat exchanger 70 and the liquid-phase heat exchanger 80 are connected via the flexible pipe 78. This flexible pipe 78 includes the extra length portion 78A that allows the lid body 30 to be opened and closed. Therefore, the lid body 30 can be opened while the gas-phase heat exchanger 70 and the liquid-phase heat exchanger 80 are connected via the flexible pipe 78.

Third Embodiment

Next, a third embodiment will be described. Note that, in the third embodiment, members and the like having the same configurations as those in the first or second embodiment are denoted by the same reference numerals, and description thereof will be omitted.

Figure 5:
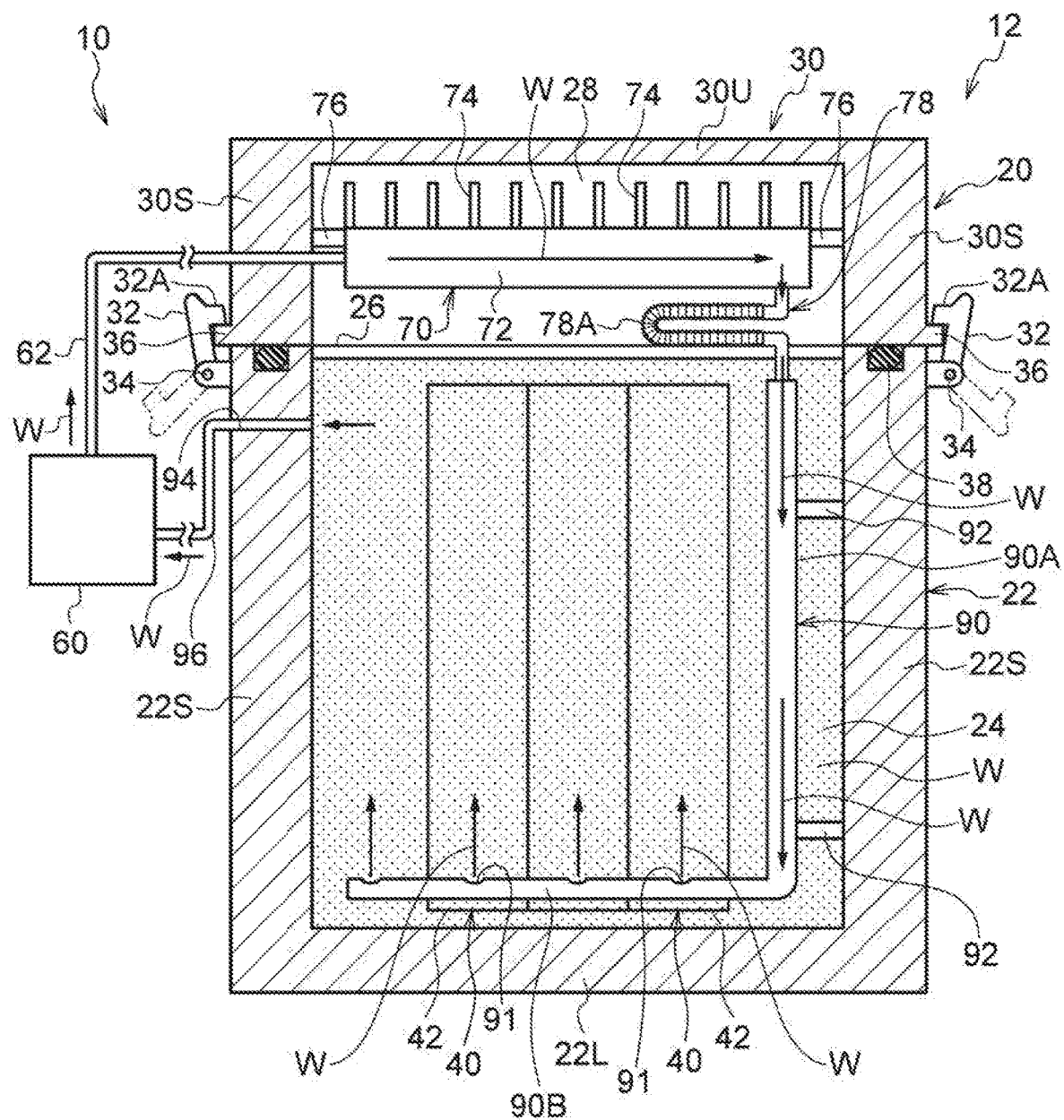
FIG. 5 is a longitudinal sectional view illustrating an immersion tank according to a third embodiment.

FIG. 5 illustrates an immersion tank 20 according to the third embodiment. In the immersion tank 20 according to the third embodiment, a cooling liquid W is circulated between the immersion tank 20 and an external cooling device 60. For example, a gas-phase heat exchanger 70 and a releasing duct 90 are provided inside the immersion tank 20.

A supply pipe (cooling liquid supply pipe) 62 is connected to the gas-phase heat exchanger 70. Therefore, the cooling liquid (refrigerant) W cooled by the external cooling device 60 is supplied to the gas-phase heat exchanger 70 via the supply pipe 62. The releasing duct 90 is connected to this gas-phase heat exchanger 70.

The releasing duct 90 extends from the gas-phase heat exchanger 70 to a storage unit 24 of a tank main body 22. Therefore, the cooling liquid W as a refrigerant that has flowed through the gas-phase heat exchanger 70 is released to the storage unit 24 via the releasing duct 90. For example, the releasing duct 90 releases the refrigerant supplied to the gas-phase heat exchanger 70 to the storage unit 24 as the cooling liquid W.

The releasing duct 90 is configured as a pipe bent in an L-shape. This releasing duct 90 includes a longitudinal duct portion 90A and a lateral duct portion 90B. The longitudinal duct portion 90A is arranged along the height direction of the tank main body 22. An upper end portion of this longitudinal duct portion 90A is connected to the gas-phase heat exchanger 70.

The longitudinal duct portion 90A extends downward from the gas-phase heat exchanger 70, and is arranged in the storage unit 24 of the tank main body 22. Furthermore, the longitudinal duct portion 90A is fixed to a side wall portion 22S of the tank main body 22 via a plurality of stays 92. In addition, a lower end portion of the longitudinal duct portion 90A is arranged on a lower end side of the storage unit 24. The lateral duct portion 908 is provided at a lower end portion of this longitudinal duct portion 90A.

The lateral duct portion 908 extends in a lateral direction from the lower end portion of the longitudinal duct portion 90A along an upper surface of a bottom wall portion 22L of the tank main body 22, and crosses a plurality of electronic units 40 on lower end sides in an elevation view. A plurality of release holes 91 is formed in this lateral duct portion 908. The cooing liquid W flowing through the lateral duct portion 908 is released to the storage unit 24 through these release holes 91.

A discharge port 94 is formed in an upper portion of the side wall portion 22S of the tank main body 22. The discharge port 94 is configured as a through-hole that passes through the side wall portion 22S. The external cooling device 60 is connected to this discharge port 94 via a cooling liquid discharge duct 96. Therefore, the cooling liquid W stored in the storage unit 24 of the tank main body 22 is discharged to the external cooling device 60 via the discharge port 94 and the cooling liquid discharge duct 96. For example, in the present embodiment, the cooling liquid W is circulated between the external cooling device 60, the gas-phase heat exchanger 70, and the storage unit 24.

(Actions)

Next, the actions of the third embodiment will be described.

According to the present embodiment, the releasing duct 90 is connected to the gas-phase heat exchanger 70. The releasing duct 90 extends from the gas-phase heat exchanger 70 to the storage unit 24. Therefore, the cooling liquid W that has flowed through the gas-phase heat exchanger 70 is released to the storage unit 24 via the releasing duct 90. Consequently, the cooling liquid W in the storage unit 24 is cooled. Accordingly, the plurality of electronic units 40 immersed in the cooling liquid W is cooled.

Furthermore, the releasing duct 90 includes the lateral duct portion 908 arranged on a lower end side of the storage unit 24. Therefore, the cooling liquid W supplied from the gas-phase heat exchanger 70 is released from the lower end side of the storage unit 24. Accordingly, the entire cooling liquid W stored in the storage unit 24 may be efficiently cooled.

Moreover, the releasing duct 90 has a higher degree of freedom in layout as compared with a heat exchanger. For this reason, the cooling liquid W may be easily supplied to a gap between adjacent electronic units 40 and an electronic unit 40 having a larger amount of heat generation among the plurality of electronic units 40. Accordingly, the cooling efficiency for the electronic units 40 is enhanced.

Note that the shape, arrangement, number, and the like of the releasing ducts 90 can be changed as appropriate. Furthermore, it is also practicable to omit the releasing duct 90 so as to directly send (flow) the cooling liquid W from the gas-phase heat exchanger 70 to the storage unit 24.

(Modifications)

Next, modifications of the above-described first, second, and third embodiments will be described. Note that, in the following, various modifications will be described by taking the first embodiment described above as an example, but these modifications can be applied to the second and third embodiments described above as appropriate.

In the above-described first embodiment, the gas-phase heat exchange unit 52 is accommodated in the upper space 28 on the side of the lid body 30. However, the gas-phase heat exchange unit 52 may be arranged to span the upper space 28 on the side of the lid body 30 and the upper space 28 on the side of the tank main body 22, or may be arranged only in the upper space 28 on the side of the tank main body 22. Note that, by arranging at least a part of the gas-phase heat exchange unit 52 in the upper space 28 on the side of the lid body 30, a space for accommodating the electronic units 40 in the tank main body 22 may be expanded.

Furthermore, in the above embodiments, the lid body 30 includes the side wall portions 30S. However, the side wall portions 30S may be omitted. In this case, the upper space is not formed in the lid body, but is formed only in an upper portion of the tank main body 22.

While embodiments of the technology disclosed in the present application has been described thus far, the technology disclosed in the present application is not restricted to the above-described embodiments. Furthermore, the above-described embodiments and various modifications may be used in combination as appropriate, and needless to say, the embodiments can be carried out in a variety of modes without departing from the gist of the technology disclosed in the present application.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An immersion tank comprising: a tank main body that includes a storage unit that stores a cooling liquid in which an electronic device is immersed, an upper part of the storage unit having an opening; a lid body that includes a top wall portion and a side wall portion, and is paired with the tank main body; and a gas-phase heat exchanger that cools a space between the storage unit and the top wall portion; wherein the gas-phase heat exchanger is arranged in the space, and is supplied with a refrigerant from outside of the tank main body, while sending the supplied refrigerant to the storage unit; and further comprising a liquid-phase heat exchanger that is arranged in the storage unit, and is supplied with the refrigerant from the gas-phase heat exchanger, while discharging the supplied refrigerant to outside of the tank main body.

2. The immersion tank according to claim 1, further comprising a heat exchanger that spans the storage unit and the space, wherein the gas-phase heat exchanger and the liquid-phase heat exchanger are provided in the heat exchanger.

3. The immersion tank according to claim 1, wherein the gas-phase heat exchanger is fixed to the lid body, and the liquid-phase heat exchanger is fixed to the tank main body, and is 30 connected to the gas-phase heat exchanger via a flexible pipe.

4. The immersion tank according to claim 3, wherein the flexible pipe includes an extra length portion that allows the lid body to be opened and closed.

5. The immersion tank according to claim 1, wherein the liquid-phase heat exchanger is arranged along an inner side surface of the storage unit.

6. The immersion tank according to claim 1, wherein the liquid-phase heat exchanger causes heat exchange between a refrigerant that flows inside the liquid-phase heat exchanger and the cooling liquid in the storage unit.

7. The immersion tank according to claim 1, further comprising a releasing duct that is connected to the gas-phase heat exchanger, and releases the refrigerant supplied from the gas-phase heat exchanger to the storage unit as the cooling liquid, wherein the tank main body includes a discharge port through which the cooling liquid in the storage unit is discharged to outside of the tank main body.

8. The immersion tank according to claim 7, wherein the releasing duct extends from the gas-phase heat exchanger to the storage unit.

9. The immersion tank according to claim 7, wherein the releasing duct releases the refrigerant supplied from the gas-phase heat exchanger to a lower portion of the storage unit as the cooling liquid, and
the discharge port is arranged in an upper portion of the storage unit.

10. The immersion tank according to claim 7, wherein the releasing duct includes a release hole that is arranged in a lower portion of the storage unit, and releases the refrigerant supplied from the gas-phase heat exchanger.

11. The immersion tank according to claim 1, wherein the space is formed across the tank main body and the lid body, and
at least a part of the gas-phase heat exchanger is accommodated in the space on the lid body side.

12. The immersion tank according to claim 1, wherein the lid body is supported by the tank main body via a hinge portion so as to be openable and closable.

13. The immersion tank according to claim 1, further comprising
a sealing material that is arranged between the tank main body and the lid body, and surrounds the opening.

14. The immersion tank according to claim 1, further comprising
a fixing hook that fixes the lid body to the tank main body.

15. The immersion tank according to claim 1, wherein the top wall portion covers the opening from above.

16. The immersion tank according to claim 1, wherein the gas-phase heat exchanger causes heat exchange between a refrigerant that flows inside the gas-phase heat exchanger and air in the space.

17. An electronic apparatus comprising: an immersion tank; and an electronic device accommodated inside the immersion tank, wherein the immersion tank includes: a tank main body that includes a storage unit that stores a cooling liquid in which the electronic device is immersed; an upper part of the storage unit having an opening; a lid body that includes a top wall portion and a side wall portion, and is paired with the tank main body; and a gas-phase heat exchanger that cools a space between the storage unit and the top wall portion; wherein the gas-phase heat exchanger is arranged in the space, and is supplied with a refrigerant from outside of the tank main body, while sending the supplied refrigerant to the storage unit; and further comprising a liquid-phase heat exchanger that is arranged in the storage unit, and is supplied with the refrigerant from the gas-phase heat exchanger, while discharging the supplied refrigerant to outside of the tank main body.

18. An immersion cooling system comprising: an immersion tank; an electronic device accommodated inside the immersion tank; and an external cooling device that is arranged outside the immersion tank, and cools a refrigerant, wherein the immersion tank includes; a tank main body that includes a storage unit that stores a cooling liquid in which the electronic device is immersed, an upper part of the storage unit having an opening; a lid body that includes a top wall portion and a side wall portion, and is paired with the tank main body; and a gas-phase heat exchanger that cools a space between the storage unit and the top wall portion; wherein the gas-phase heat exchanger is arranged in the space, and is supplied with the refrigerant from outside of the tank main body, while sending the supplied refrigerant to the storage unit; and further comprising a liquid-phase heat exchanger that is arranged in the storage unit, and is supplied with the refrigerant from the gas-phase heat exchanger, while, discharging the supplied refrigerant to outside of the tank main body.

* * * * *